(12) United States Patent
Oila

(10) Patent No.: US 7,442,059 B2
(45) Date of Patent: Oct. 28, 2008

(54) APPARATUS AND METHOD FOR THE INSERTION AND WITHDRAWAL OF PLUG-IN MODULES

(75) Inventor: Kari Oila, Zurich (CH)

(73) Assignee: ELMA Eletronic AG, Wetzikon (CH)

( * ) Notice: Subject to any disclaimer, the term of this patent is extended or adjusted under 35 U.S.C. 154(b) by 0 days.

(21) Appl. No.: 11/594,498

(22) Filed: Nov. 7, 2006

(65) Prior Publication Data
US 2007/0111574 A1 May 17, 2007

(30) Foreign Application Priority Data
Nov. 11, 2005 (EP) .................. 05405629

(51) Int. Cl.
H01R 13/62 (2006.01)

(52) U.S. Cl. ...................... 439/160; 439/188

(58) Field of Classification Search .......... 439/157, 439/159, 160, 188
See application file for complete search history.

(56) References Cited

U.S. PATENT DOCUMENTS

| | | | |
|---|---|---|---|
| 6,190,188 B1 * | 2/2001 | Koradia et al. | 439/160 |
| 6,352,441 B2 * | 3/2002 | Koradia et al. | 439/160 |
| 7,297,008 B2 * | 11/2007 | Griffin | 439/157 |
| 2001/0008812 A1 * | 7/2001 | Nishioka | 439/157 |
| 2001/0046800 A1 * | 11/2001 | Koradia et al. | 439/160 |
| 2004/0106318 A1 | 6/2004 | Westphall | |
| 2004/0192095 A1 * | 9/2004 | Joist | 439/188 |
| 2004/0242039 A1 * | 12/2004 | Griffin | 439/157 |
| 2005/0136715 A1 * | 6/2005 | Schlack | 439/160 |
| 2005/0208806 A1 * | 9/2005 | Oila et al. | 439/160 |
| 2007/0111574 A1 * | 5/2007 | Oila | 439/188 |

FOREIGN PATENT DOCUMENTS

| | | |
|---|---|---|
| DE | 20311072 U1 | 9/2003 |
| JP | 01-164098 A | 6/1989 |
| JP | 04 003996 A | 1/1992 |

* cited by examiner

Primary Examiner—James Harvey
(74) Attorney, Agent, or Firm—Townsend and Townsend and Crew, LLP

(57) ABSTRACT

An apparatus for the insertion and withdrawal of a plug-in module with front panel into and out of a module carrier, includes a lever arm (2) pivotable about an axis (3) with a handle portion (2a) for the rotation of the lever arm as well as a bolt (5) to lock the lever arm and an operating element (5a) connected to the bolt with which the lever arm can be unlocked. The operating element (5a) is arranged spaced from the lever arm (2), and the handle portion (2a) is designed such that it contacts the front panel (10) of the plug-in module the inwardly pivoted position.

8 Claims, 2 Drawing Sheets

APPARATUS AND METHOD FOR THE INSERTION AND WITHDRAWAL OF PLUG-IN MODULES

Figure 1:
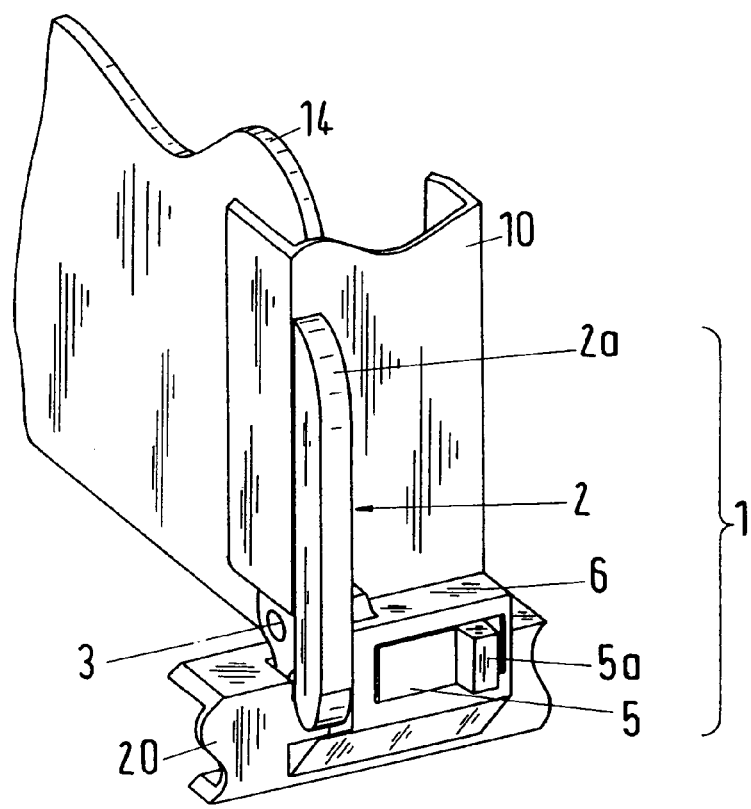

This application claims the priority of European Patent Application No. 05405629.6, filed Nov. 11, 2005, the disclosure of which is incorporated herein by reference.

The invention relates to an apparatus for the insertion and withdrawal of a plug-in module with a front panel into or out of a module carrier according to the preamble of claim 1, to a plug-in module with such an apparatus and to a module carrier with such a plug-in module as well as to a method for the insertion and withdrawal of a plug-in module with front panel according to claim 7.

Plug-in modules introducible into module carriers have multiple plug connections at the rear side for which plug-in and removal forces have to be overcome on the insertion or withdrawal of the plug-in module. Plug-in modules are therefore usually provided with one or more apparatuses, for example a respective apparatus in a lower area and an upper area of the front side, in order to facilitate the insertion and the removal. The apparatuses each include a lever arm which is pivotally arranged and resting against a front side section of the module carrier such that the insertion and withdrawal is facilitated through the effect of the lever arm. The apparatuses each further include a locking device to lock and/or to secure the lever arm in an inwardly pivoted state as well as, if necessary, a switching element actuatable by means of a lever arm or locking device in order to switch off the power or switch the plug-in module into a passive mode before withdrawal.

A plug-in module with a front panel is known from document DE 203 11 072 U1 in which a blocking lever is hinged to a lever pulling handle that includes a latching catch, in order to secure the lever pulling handle in the inwardly pivoted position. The latching catch is operationally connected to a switch attached to the circuit board of the plug-in module, so that the plug-in module can be switched into a current-free state on actuation of the blocking lever. A drawback of this plug-in module is the close arrangement of the handle portions of the lever pulling handle and of the blocking lever directly next to one another, which makes it possible to actuate both handle portions practically simultaneously. This leads to a situation in which the time gap between the activation of the switch and the separation of the rear side plug connections through removal of the plug-in module is very short through quick rotation of the lever pulling handle, for example shorter than 100 ms, and in which the plug-in module is pulled out before it is in a passive state. Depending on the usage of the plug-in module, the electrical contacts of the plug-in modules at the rear side, and/or the electrical circuit of the plug-in module or of associated parts of the system, can be damaged. A further disadvantage of the above described plug-in module exists in that the close arrangement of the handle parts of the lever pulling handle and of the blocking lever directly alongside one another encourages the outward pivoting of the lever pulling handle before the latching catch is completely released. This can lead to premature wear of the latching catch.

The object of the invention is to provide an apparatus for the insertion and removal of a plug-in module with front panel into, or respectively out of, a module carrier, a plug-in module with such an apparatus and a module carrier with such a plug-in module as well as a method for the insertion and withdrawal of a plug-in module with front panel, which avoids the above described disadvantages of the prior art.

This object is satisfied in accordance with the invention by the apparatus for insertion and withdrawal of a plug-in module with a front panel defined in claim 1 as well as by the method defined in claim 7, the plug-in module defined in claim 10, and the module carrier defined in claim 11.

The apparatus for the insertion and withdrawal of a plug-in module with front panel into and out of a module carrier in accordance with the invention includes a lever arm pivotable about an axis with a handle portion for the pivoting of the lever arm as well as a locking element for the locking of the lever arm in an inwardly pivoted state and an operating element for the unlocking of the same, the operating element being, for example, connected to the locking element and with it being possible to unlock the lever arm by means of the operating element. In the apparatus of the invention, the actuating element is arranged spaced from the lever arm, with the handle portion being designed such that it contacts the front panel of the plug-in module in an inwardly pivoted state.

In a preferred embodiment, the lever arm is pivotable into an intermediate position after the unlocking, and is preferably automatically pivotable into an intermediate position.

In a further preferred embodiment, the apparatus includes a holding part, for example for the holding of the locking element and/or of the actuation element, and, in a further preferred embodiment, a switching element for an active/passive switching and/or switching the plug-in module to a current-free state, the switching element being actuatable by means of the locking element and/or of the operating element, and being advantageously secured to the holding part. In a preferred variation a centering pin for the centering of the plug-in module is provided at the holding part.

In a further preferred variant, the locking element is formed to lock automatically, in order to secure the lever arm in an inwardly pivoted position, for example in that the locking element is operatively connected to a return spring.

The invention further includes a method for the insertion and withdrawal of a plug-in module with front panel into and out of a module carrier by means of an apparatus, which includes a pivotable lever arm with lock. For the withdrawal of the plug-in module the inwardly pivoted and locked lever arm is unlocked by means of an operating element, which is arranged spaced from the lever arm; the unlocked lever arm pivots outwards automatically into an intermediate position, whereby the plug-in module is pulled out; and, for the insertion of the plug-in module, the lever arm is pivoted inwardly by the handle portion until the handle portion contacts on the front panel; and the inwardly rotated lever arm locks automatically.

In a preferred embodiment, the introduction of a finger between the handle portion and front panel is made more difficult or hindered through the design of the handle portion and/or the contact of the handle portion at the front panel.

In a further preferred embodiment a switching element is operated upon the locking and/or the unlocking of the lever arm.

The invention further includes a plug-in module with front panel which includes at least one of the above described embodiments of an apparatus for the insertion and withdrawal of the plug-in module, and/or a plug-in module with front panel to implement the above described method, and/or a module carrier with at least one such plug-in module.

The apparatus according to the invention and the method according to the invention for the insertion and withdrawal of a plug-in module with front panel have the advantage that the unlocking procedure is separated from the pulling out procedure, since a simultaneous actuation of the operating element for the unlocking and of the handle portion for the outward pivoting of the lever arm is made more difficult or prevented entirely by the spaced arrangement of the actuation element and the design of the handle portion, which contacts the front panel in the inwardly pivoted state, or is countersunk. This is valid particularly for plug-in modules, which are each designed with one apparatus in each of a lower area and an upper area of the front side, and which can only be pulled out when the lever arms of the lower and upper apparatus are simultaneously pivoted outwardly. I.e. a service person must operate one apparatus with each of the left and right hands to pull out the plug-in module. Since the handle portions contact the front panel in the inwardly pivoted and locked position of the lever arm, a service person would be required to first unlock the lever arms, whereby these are automatically pivoted outwardly into an intermediate position. In the intermediate position, the handle portions of the lever arms may be subsequently comfortably grasped and outwardly pivoted. A grasping of the handle portions for the outward pivoting of the lever arms is made more difficult or prevented, so long as they find themselves in an inwardly pivoted state, by the contact of the handle portions on the front panel and a respective given form of the handle portions. Advantageously, such handle portions are designed so that the insertion of fingers between the handle portion and front panel is made difficult or prevented so long as the handle portion contacts the front panel. Thanks to the separation of the unlocking and withdrawal procedures, damage or wearing out of the locking device through outward pivoting of the lever arm before this is fully unlocked is largely avoided.

It is also advantageous that, on passive switching of the plug-in module, a minimal time interval between the actuation of the switching element upon unlocking and the separation of the plug connections at the rear side upon withdrawal of the plug-in module can be lengthened, thanks to the separation between the unlocking procedure and the withdrawal procedure.

The attachment of the switching element for active/passive switching of the plug-in module, i.e. switching it to a current-free state, to a holding part of the apparatus for insertion and withdrawal of the same is further advantageous, since in this case the switching element must not be separately attached and/or soldered to the circuit board of the plug-in module, but can rather be connected to the circuit board by means of connection cables, particularly connection cables with plug contacts. The connection is advantageously made via plug contacts to the component side of the circuit board. The soldering of the plug contacts to the circuit board can take place together with the soldering of the remaining components, so that the effort for the connection of the switching element is comparatively small.

The above description of embodiments of the apparatus according to the invention and of the methods according to the invention merely serves as an example. Further preferred embodiments can be seen from the dependent claims and the drawings. In addition, in the context of the present invention, individual features can also be combined together from the embodiments described or shown, to form new embodiments.

Figure 2:
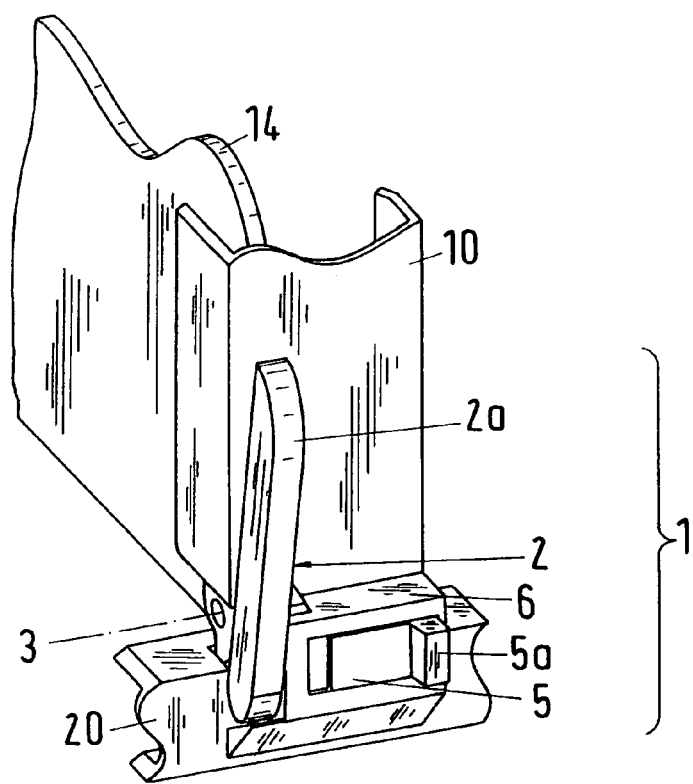
Figure 3C:
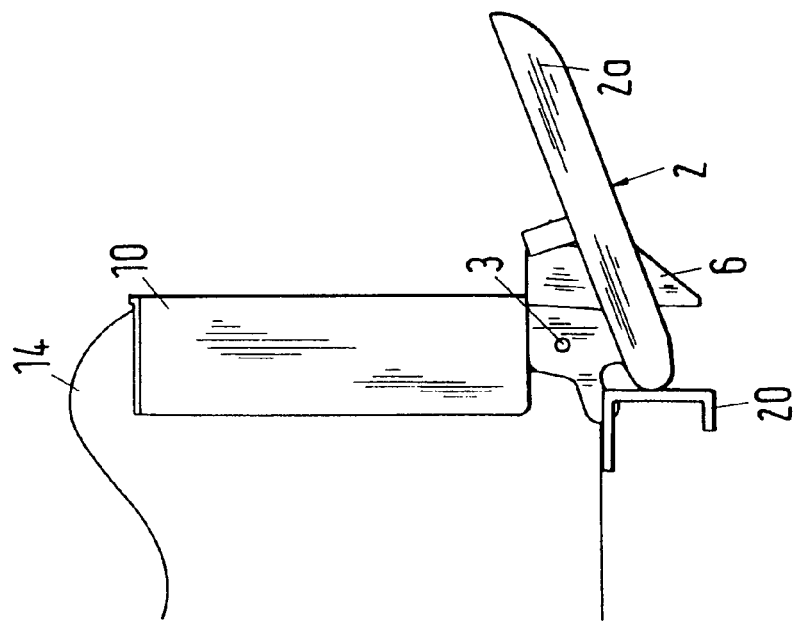
Figure 3B:
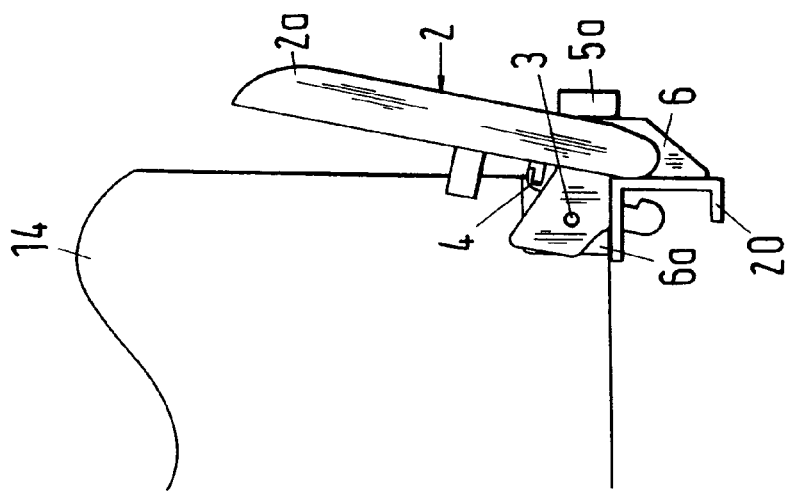
Figure 3A:
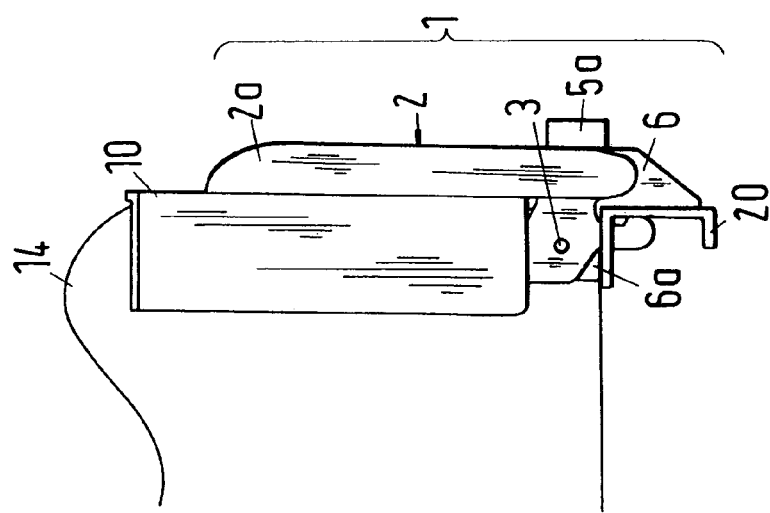

The invention will be explained in more detail in the following with reference to the embodiment and to the drawings. They show:

FIG. 1 a perspective view of a section of a plug-in module with an embodiment of an apparatus for the insertion and withdrawal of the plug-in module according to the present invention with a lever arm in an inwardly pivoted state, FIG. 2 the embodiment shown in FIG. 1 with the lever arm in an intermediate position, FIG. 3a a side view of the embodiment with the lever arm in an inwardly pivoted position, FIG. 3b a side view of the embodiment with the lever arm in an intermediate position, and FIG. 3c a side view of the embodiment with the lever arm in an outwardly pivoted position.

FIG. 1 shows a perspective view of a section of a plug-in module—with an embodiment of an apparatus for the insertion and withdrawal of the plug-in module according to the present invention—having a lever arm 2 in an inwardly pivoted state. The plug-in module shown includes, apart from apparatus 1 for the insertion and withdrawal, a front section 10, in the following simply called a front panel, and optionally a circuit board 14. The lever arm 2 of the apparatus is furnished with a handle portion 2a, by which means the lever arm can be pivoted about an axis 3. In the embodiment shown in FIG. 1, an area at the end of the lever arm, which is spaced far enough from the axis, e.g. by more than 1.5 cm, serves as a handle portion. Naturally, other forms of the handle portion are also possible, so long as it lies on the front panel in an inwardly pivoted state. By way of example, a shape other than that shown can be formed on or molded onto the lever arm, or a suitable handle portion can be slipped over the end of the lever arm. In a further variant the handle portion and the front panel are formed such that the handle portion is completely or partly countersunk into the front panel in the inwardly pivoted state of the lever arm.

The apparatus of the embodiment shown in FIG. 1 further includes a locking element 5, which can be formed as a simple locking bolt, which in the inwardly pivoted state of the lever arm engages into it, to lock and/or secure the lever arm. In a preferred embodiment the locking element 5 is pre-stressed, for example by means of a spring, so that it latches into or at the lever arm 2 and locks this automatically as soon as the lever arm finds itself in an inwardly pivoted position. The apparatus further includes an operating element 5a for the unlocking of the lever arm as well as, if required, a holding part 6 for the holding of the locking element 5. The operating element can, for example as shown in FIG. 1, be formed as a protruding nose on the locking element 5, and the locking element can be moveably guided in the holding part 6. In addition, the operating element 5a can be visually emphasized, for example by appropriate colouring.

FIG. 1 further shows a front section 20 of a module carrier, into which the plug-in module is inserted. The apparatus 1 for insertion and withdrawal of the plug-in module is arranged in the lower area of the front panel 10 of the plug-in module such that in the inwardly pivoted state of the associated lever arm 2 the front section 20 of the module carrier engages into a recess of the lever arm, so that the plug-in module cannot be withdrawn without outward pivoting of the same. The lever arm is locked by means of the locking element 5 in the inwardly pivoted state, wherein the plug-in module is secured against unintentional withdrawal or a loosening and sliding out under the influence of jolts or vibrations.

FIG. 2 shows the embodiment described in FIG. 1 with the lever arm in an intermediate position. The reference numbers for the individual components have been retained, so that only the differences relative to FIG. 1 will be described in the following. In FIG. 2 the lever arm 2 of the apparatus 1 for the insertion and withdrawal of the plug-in module is unlocked and outwardly pivoted into an intermediate position, for example by an angle of from 5° to 20°, preferably from 8° to 15° in relation to the inwardly pivoted state. In the illustrated intermediate position the handle portion 2a of the lever arm can easily be grasped, so that it can subsequently be further outwardly pivoted by hand. The unlocked state can be recognised by the position of the operating element 5a, which is slid to the right in the embodiment shown in FIG. 2. Additionally, the locking element 5 can be designed with two colours, so that the second colour is only visible if it is engaged and/or unlocked. In a preferred variation, the lever arm 2 is biased, for example by means of a return spring, so that the lever arm automatically pivots into the intermediate position after the unlocking.

FIGS. 3a-c show side views of an embodiment of an apparatus for the insertion and withdrawal of a plug-in module according to the present invention with a lever arm 2 in three different positions as well as sections from the associated plug-in modules. The plug-in modules shown in FIG. 3a include an apparatus 1 for insertion and withdrawal of the same, a front section 10, referred to simply as a front panel in the following, and a circuit board 14. The lever arm 2 of the apparatus is provided with a handle portion 2a, by means of which the lever arm can be pivoted about an axis 3. In FIG. 3a, the lever arm is shown in an inwardly pivoted state, wherein the handle portion 2a contacts the front panel 10. The handle portion can also have forms other than the one shown, wherein the handle portion is purposely formed so that grasping it is made more difficult in the inwardly pivoted state of the lever arm, and/or that the introduction of a finger between the handle portion and front panel is made difficult or prevented by the lying of the handle portion on the front panel.

In the embodiment shown, the apparatus further includes a locking element, which is not visible in FIG. 3a, in order to lock and/or secure the lever arm, and an operating element 5a for the unlocking of the lever arm as well as a holding part 6 for the holding of the locking element. FIG. 3a further shows a front section 20 of a module carrier, into which the plug-in module is set. The apparatus 1 for the insertion and withdrawal of the plug-in module is arranged in the lower part of the front panel 10 of the plug-in module, such that the front section 20 of the module carrier engages into a recess of the lever arm in the inwardly pivoted state of the associated lever arm 2, so that the plug-in module cannot be withdrawn without outward pivoting of the same. The lever arm is locked in the inwardly pivoted state by means of the locking element, whereby the plug-in module is secured against unintentional withdrawal or loosening.

In an advantageous variant, the holding part 6 includes a protruding operating element 6a in the direction of the circuit board 14, in order to attach the holding part to the circuit board. The axis 3, about which the lever arm 2 is pivotable, is formed advantageously as a fastener element, for example as a screw, precision dowel screw, bolt or rivet, by which means the operating element 6a can be attached to the circuit board 14.

In the section of the plug-in module shown in FIG. 3b, the front panel of the same has been omitted to make the entire lever arm visible. The lever arm is shown in FIG. 3b in an intermediate position, in which it is pivoted outwardly after unlocking, for example by an angle from 5° to 20°, advantageously 8° to 15°. In an advantageous variant, the lever arm 2 is prestressed, for example by means of a return spring 4, so that the lever arm is automatically pivoted into the intermediate position after unlocking. In the intermediate position shown, the end of the lever arm opposite to the handle part is supported on a front section 20 of a plug-in module, whereas the handle portion 2a of the lever arm can now be comfortably grasped and subsequently pivoted further outwardly, wherein the plug-in modules are pulled out of the module carrier and the connection plugs are separated on the rear side of the plug-in module.

In FIG. 3c the lever arm 2 is shown in an outwardly pivoted state. The plug connections on the rear side of the plug-in module are now separated, so that they can be pulled out of the module carrier without any supporting means. Vice-versa, during the manual insertion, the plug-in module is brought into the position shown in FIG. 3c and slid fully into the module carrier by pivoting of the lever arm 2, with a recess of the lever arm being supported on the front section 20 of the module carrier, in order to overcome the insertion forces of the plug connections on the rear side of the plug-in module.

An exemplary embodiment of the method according to the invention for the insertion and withdrawal of a plug-in module with a front panel into and out of a module carrier respectively will be explained with reference to the FIGS. 3a-c. The insertion and withdrawal of the plug-in module is conducted in the embodiment by means of an apparatus including a pivotable lever arm 2 with a lock. For the withdrawal of the plug-in module, the inwardly pivoted and locked lever arm 2, e.g. a lever arm as shown in FIG. 3a, is unlocked by means of an operating element 5a, which, as shown for example in FIG. 1, is arranged spaced from the lever arm and the unlocked lever arm is outwardly pivoted into an intermediate position and is in particular automatically pivoted into an intermediate position. A possible intermediate position is shown in FIG. 3b. Subsequently, the lever arm is pivoted further outward by means of a handle portion 2a of the same, whereby the plug-in module is withdrawn. FIG. 3c shows a possible example of a lever arm in an outwardly pivoted state. For the insertion of the plug-in module, the lever arm is inwardly pivoted with the handle portion 2a until the handle portion contacts the front panel 10, and the inwardly pivoted lever arm is automatically locked.

In a preferred embodiment of the method, the introduction of a finger between handle portion and front panel is made difficult or prevented through the design of the handle portion and/or the contact of the handle portion at the front panel.

In a further preferred embodiment of the method, a switching element for active/passive switching of the plug-in module is actuated by the locking and/or the unlocking of the lever arm 2.

A separation of the unlocking procedure from the pull-out procedure is achieved thanks to the design of the handle portion of the lever arm in the apparatus for the insertion and withdrawal of a plug-in module with front panel, which contacts the front panel of the plug-in module in the inwardly pivoted state or is countersunk in it and/or in the spaced arrangement of the operating element for unlocking. In this way, possible damage to the locking element of the lever arm is prevented, as can happen if the unlocking procedure merges into the withdrawal procedure without separation. In addition, it is advantageous that if the active/passive switching or switching of the plug-in module to a current-free state is coupled to the unlocking procedure, the minimal time between the operation of the switching element during the unlocking and the separation of the rear side plug connections on withdrawal of the plug-in module can then be extended.

The invention claimed is:

1. An apparatus for the insertion and withdrawal of a plug-in module with front panel into and out of a module carrier, which apparatus (1) includes a lever arm (2) pivotable about an axis (3) with a handle portion (2a) for the rotation of the lever arm as well as a locking element (5) to lock the lever arm in an inwardly pivoted position and an operating element (5a) to unlock the same, characterized in that the operating element (5a) is arranged spaced from the lever arm (2), and the handle portion (2a) is set out such that it contacts the front panel of the plug-in module in the inwardly pivoted position.

2. An apparatus according to claim 1, wherein the lever arm (2) is pivotable into an intermediate position after the unlocking, in particular automatically pivotable into an intermediate position.

3. An apparatus according to claim 1 including a holding part (6), in particular a holding part for the holding of the locking element (5) and/or of the operating element (5*a*).

4. An apparatus according to claim 1 including a switching element for an active/passive switching of the plug-in module, said switching element being operable by means of the locking element (5) and/or of the operating element (5*a*), and said switching element being in particular secured on the holding part (6).

5. An apparatus for lifting in and out according to claim 3, wherein a centering pin for the centering of the plug-in module upon insertion is provided on the holding part (6).

6. An apparatus according to claim 1, wherein the lock element (5) is formed to latch automatically, in order to secure the lever arm (2) in the inwardly pivoted position.

7. A plug-in module with front panel including at least one apparatus (1) according to claim 1 for the insertion and withdrawl of the plug-in module into and out of a module carrier respectively and/or a plug-in module with front panel.

8. A module carrier comprising an apparatus according to claim 1 and including at least one plug-in module.

* * * * *